United States Patent
Li et al.

(10) Patent No.: US 11,183,951 B2
(45) Date of Patent: Nov. 23, 2021

(54) FLEXURE STAGE WITH MODULARIZED FLEXURE UNITS

(71) Applicant: Hiwin Mikrosystem Corp., Taichung (TW)

(72) Inventors: Chun-Hsiang Li, Taichung (TW); Chih-Kai Fan, Taichung (TW); Yu-Jung Chang, Taichung (TW)

(73) Assignee: HIWIN MTKROSYSTEM CORP., Taichung (TW)

( * ) Notice: Subject to any disclaimer, the term of this patent is extended or adjusted under 35 U.S.C. 154(b) by 430 days.

(21) Appl. No.: 16/268,146

(22) Filed: Feb. 5, 2019

(65) Prior Publication Data

US 2020/0252008 A1 Aug. 6, 2020

(51) Int. Cl.
*H02N 2/02* (2006.01)
*H01L 21/68* (2006.01)
*H01L 21/673* (2006.01)

(52) U.S. Cl.
CPC ............. *H02N 2/028* (2013.01); *H01L 21/68* (2013.01); *H01L 21/67346* (2013.01); *H02N 2/02* (2013.01)

(58) Field of Classification Search
CPC . H02N 2/028; H02N 2/02; H02N 2/68; H01L 21/68; H01L 21/68785; H01L 21/67346
See application file for complete search history.

(56) References Cited

U.S. PATENT DOCUMENTS

| 7,267,005 | B1 * | 9/2007 | Kranz | G01C 19/5719 73/504.12 |
| 2006/0196266 | A1 * | 9/2006 | Holt | G01C 19/5719 73/504.02 |
| 2017/0336017 | A1 * | 11/2017 | Mosier | H02N 2/046 |

* cited by examiner

*Primary Examiner* — Emily P Pham
(74) *Attorney, Agent, or Firm* — Muncy, Geissler, Olds & Lowe, P.C.

(57) ABSTRACT

A flexure stage with modularized flexure units for convenient manufacturing, assembly and repair is provided. The flexure stage comprises a base, a platform separated from the base, and a plurality of flexure units disposed between the base and the platform. Each flexure unit comprises a first section, a second section, and a third section. The first section is located on the base. The second section is connected with the platform and separated from the first section. The third section is coupled with the first section and the second section through the first bending part and the second bending part respectively wherein the first bending part and the second bending part comprises flexibility in different axial directions.

10 Claims, 6 Drawing Sheets

FLEXURE STAGE WITH MODULARIZED FLEXURE UNITS

BACKGROUND OF THE INVENTION

Field of the Invention

The invention relates to a stage, and more particularly to a flexure stage with higher precision and response.

Description of the Related Art

As the development of the nanoscale science for the semiconductor, the stage with high precision and response is provided to meet the requirement. Due to the high speed movement, the carrier vibrates severely before stop state such that the setting time is lengthened to position the carrier precisely.

The conventional technology disclosed a stage system comprising a flexure frame to produce a compensating displacement to offset error and shorten the setting time. The conventional flexure frame is integrated as a whole to raise the strength thereof. However, the integrated flexure frame is not only hard manufacturing but repaired difficulty after assembling with the stage.

Accordingly, there is a need in the art for a stage with individually replaceable flexure units to solve the conventional problems.

SUMMARY OF THE INVENTION

In view of the disadvantages of prior art, the object of the present invention is to provide a flexure stage with modularized flexure units for convenient manufacturing, assembly and repair.

To achieve the above object, the flexure stage comprises a base, a platform separated from the base, and a plurality of flexure units disposed between the base and the platform. Each flexure unit comprises a first section, a second section, and a third section. The first section is located on the base. The second section is connected with the platform and separated from the first section. The third section is coupled with the first section and the second section through the first bending part and the second bending part 35 respectively wherein the first bending part and the second bending part comprises flexibility in different axial directions.

In one embodiment of the present invention, the third section comprises an opening holding the first bending part with a first connection element, a first elastic element and a second elastic element wherein the first elastic element is bridged between the first connection element and the second section, and the second elastic element is bridged between the first connection element and the wall of the opening.

In one embodiment of the present invention, the first section comprises an opening holding the second bending part with a second connection element, a third elastic element and a fourth elastic element wherein the third elastic element is bridged between the second connection element and the edge of the third section, and the fourth elastic element is bridged between the second connection element and the wall of the opening.

In other embodiments of the present invention, the first section, the second section, the third section, the first bending part and the second bending part are not limited in the disclosed configuration, and can be designed in diverse arrangement, number and shape according to the requirement.

DETAILED DESCRIPTION OF THE PREFERRED EMBODIMENTS

Figure 1:
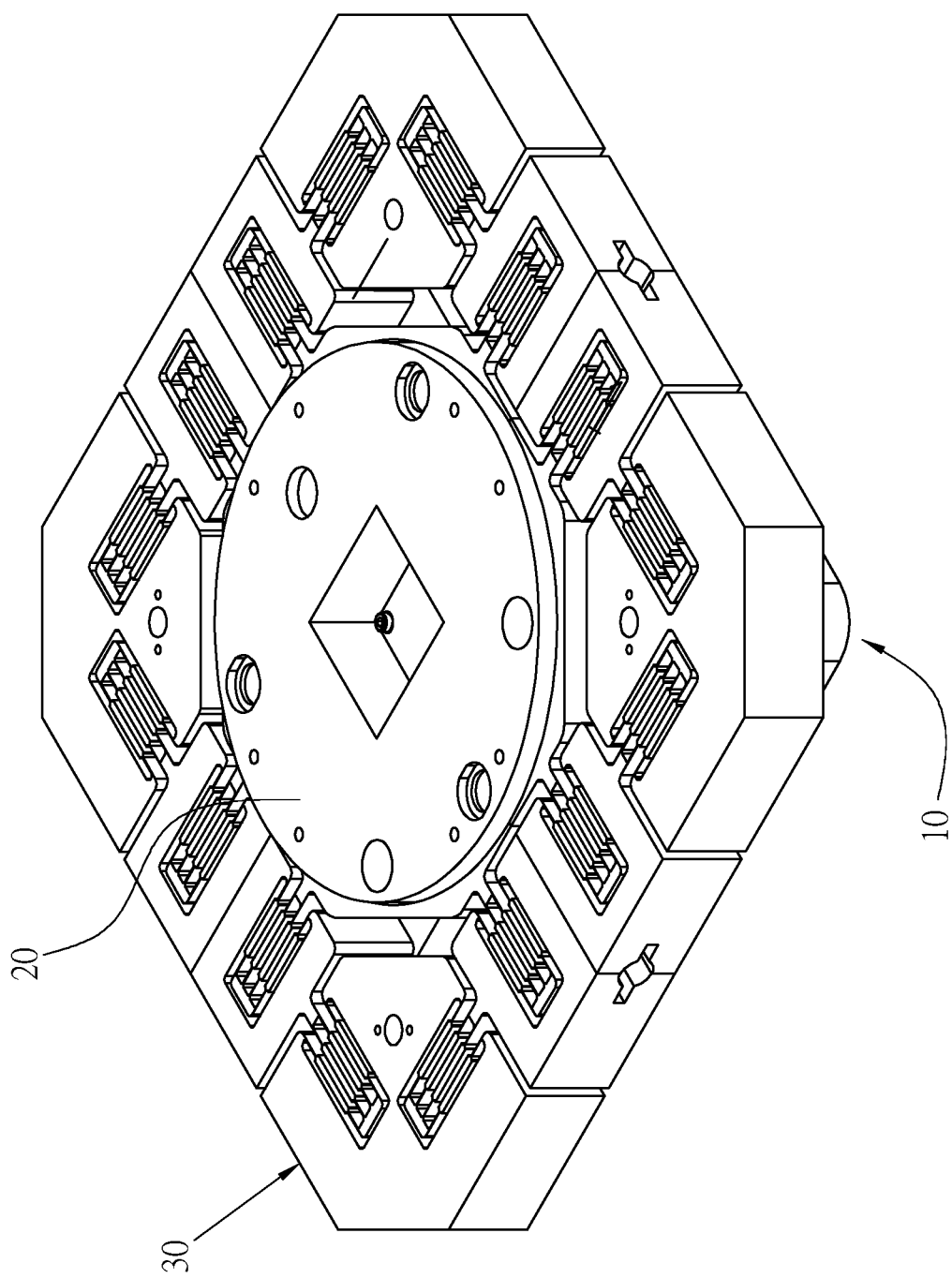
FIG. 1 is a schematic view of the flexure stage of the first embodiment of the present invention.
Figure 2:
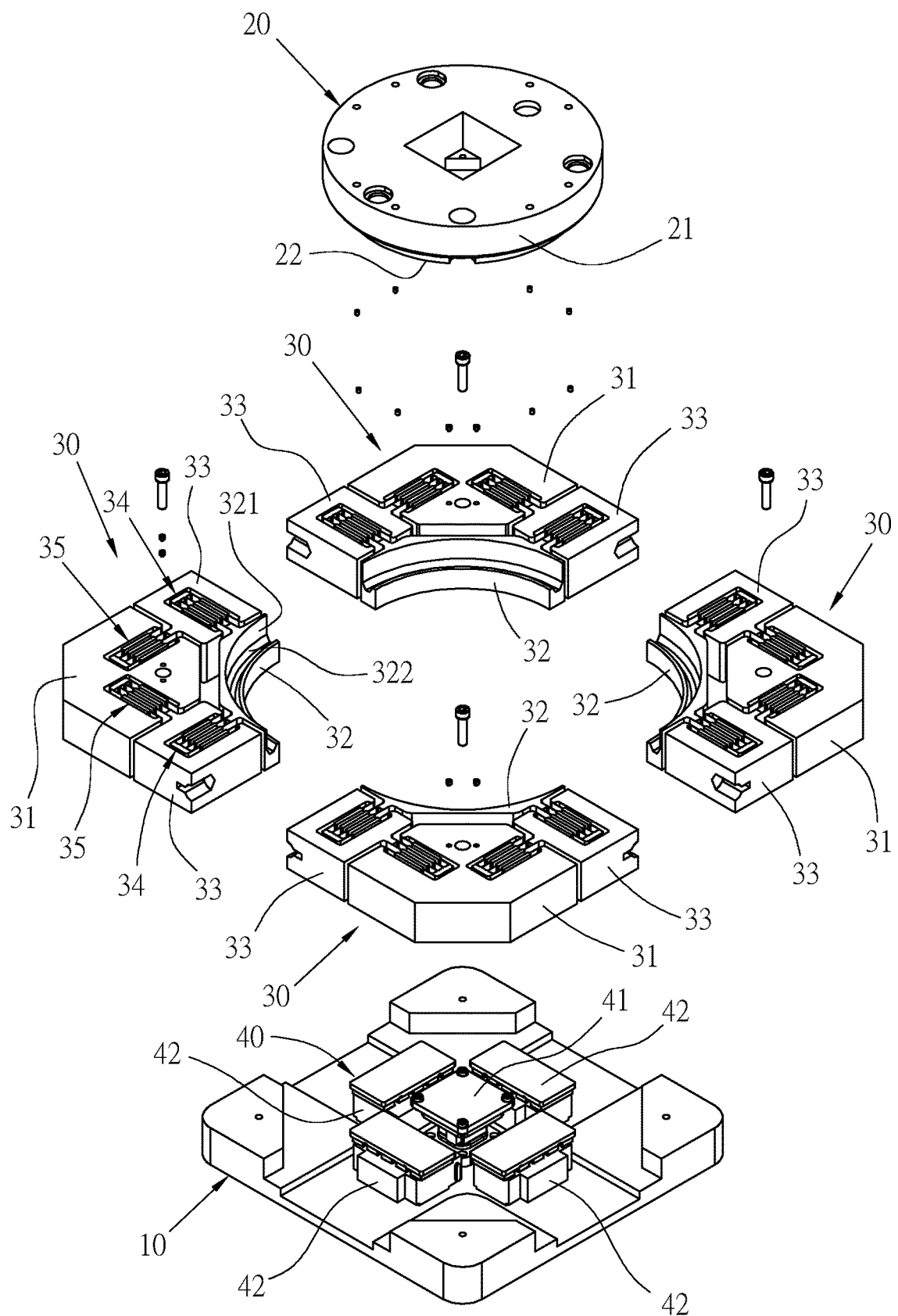
FIG. 2 is an exploded view of the flexure stage of the first embodiment of the present invention.
Figure 3:
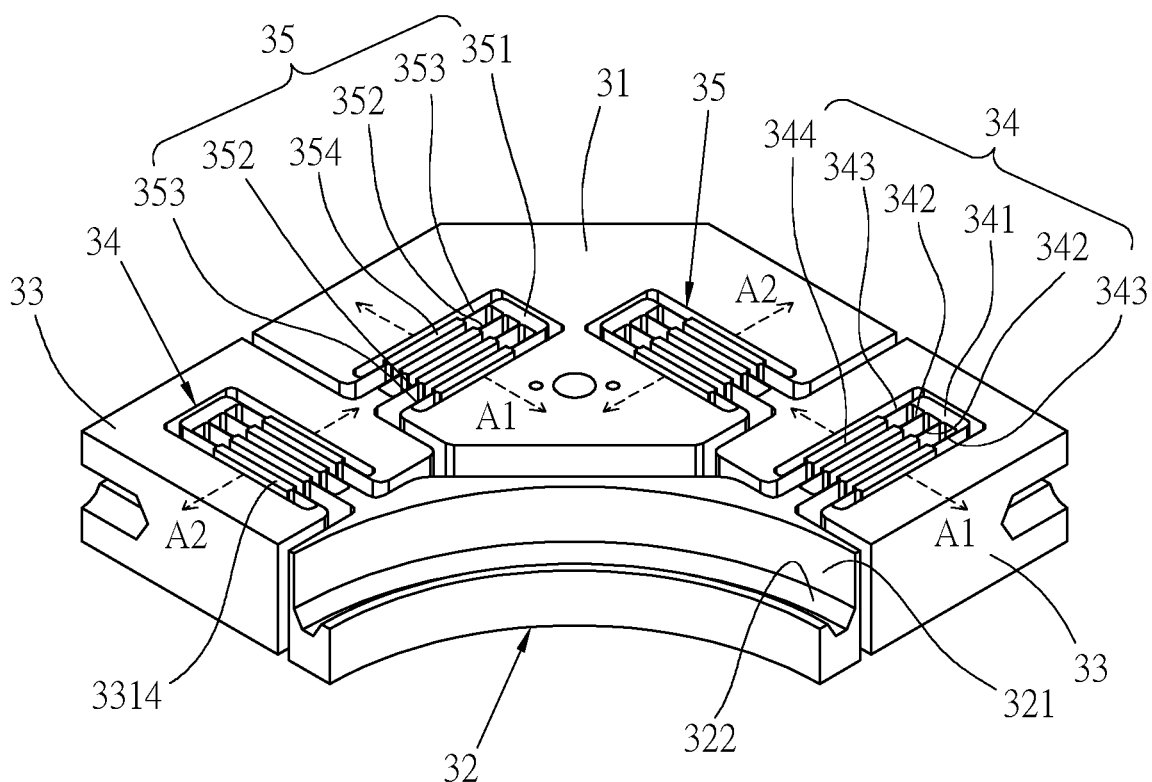
FIG. 3 is a schematic view of the flexure unit of the first embodiment of the present invention.
Figure 4:
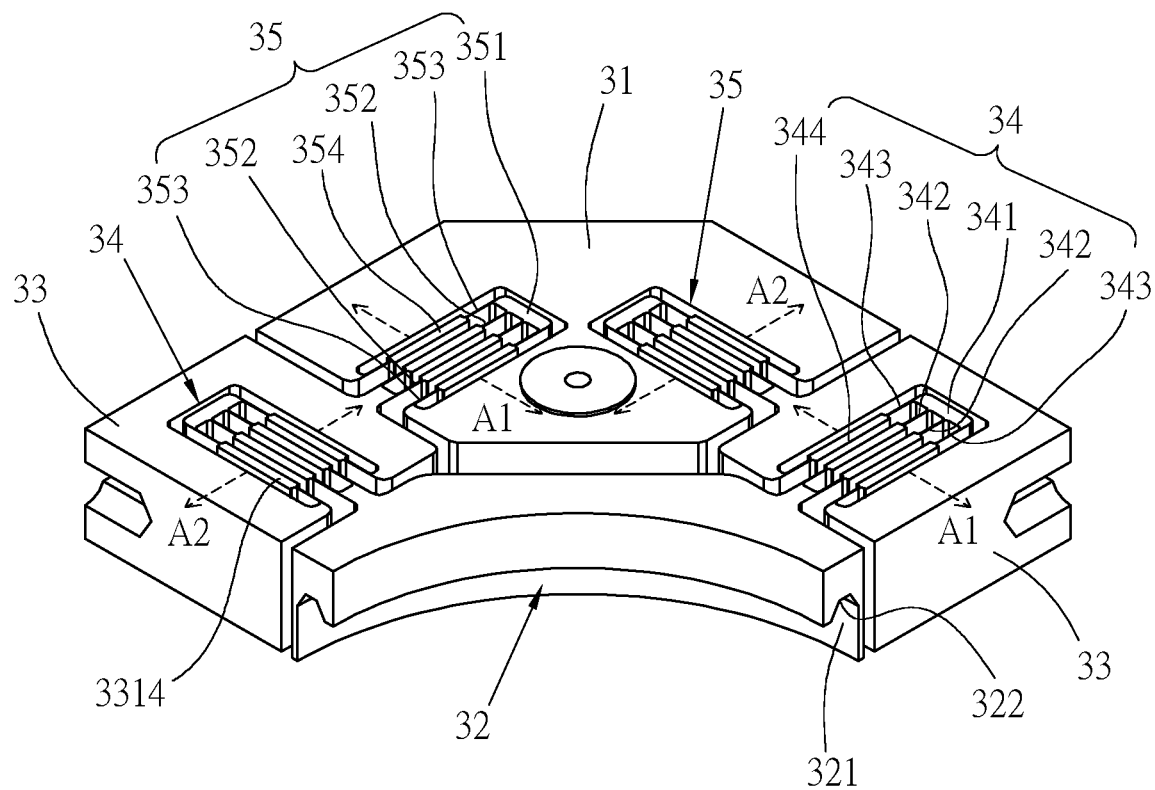
FIG. 4 is another schematic view of the flexure unit of the first embodiment of the present invention.
Figure 5:
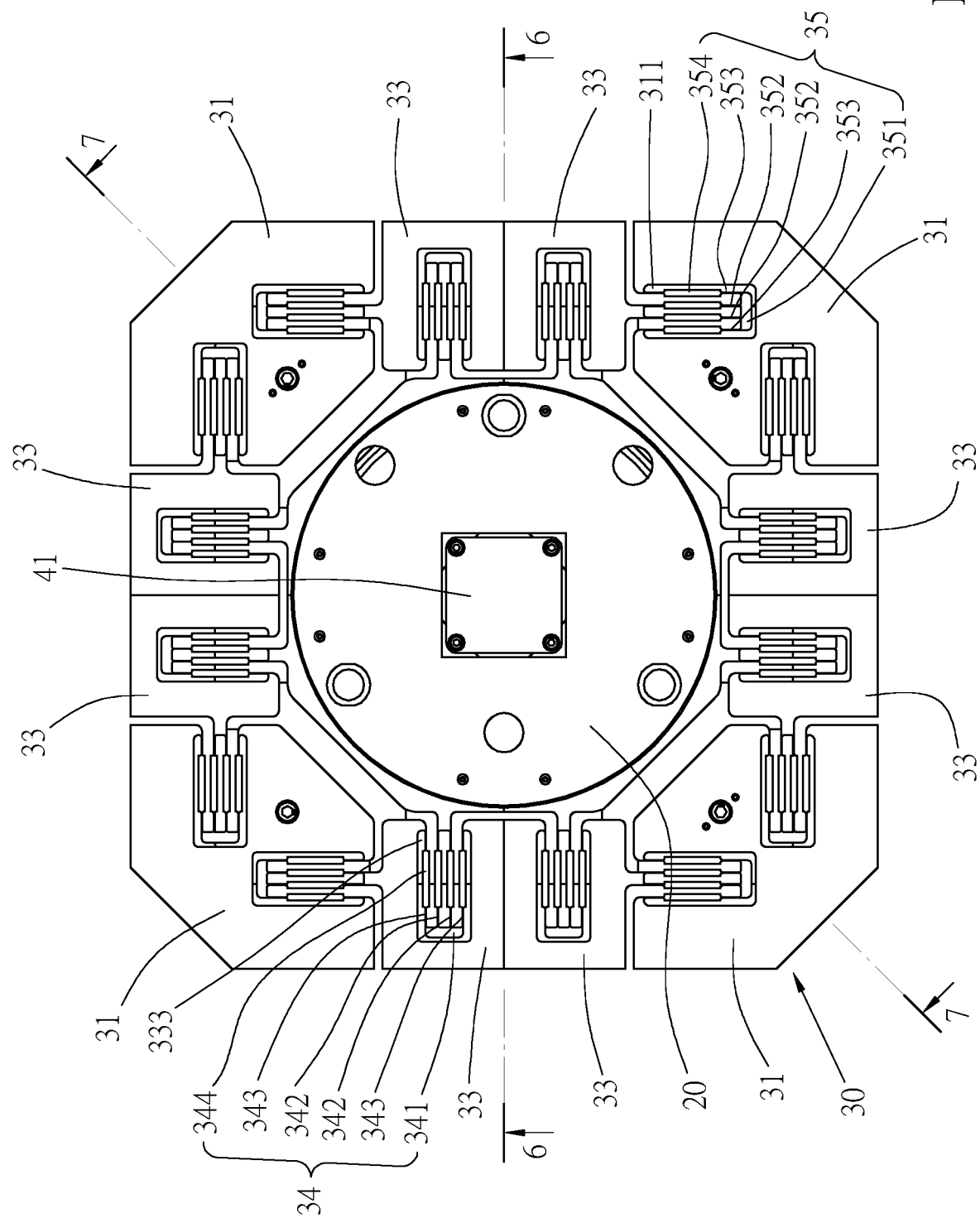
FIG. 5 is a top view of the flexure stage of the first embodiment of the present invention.
Figure 6:
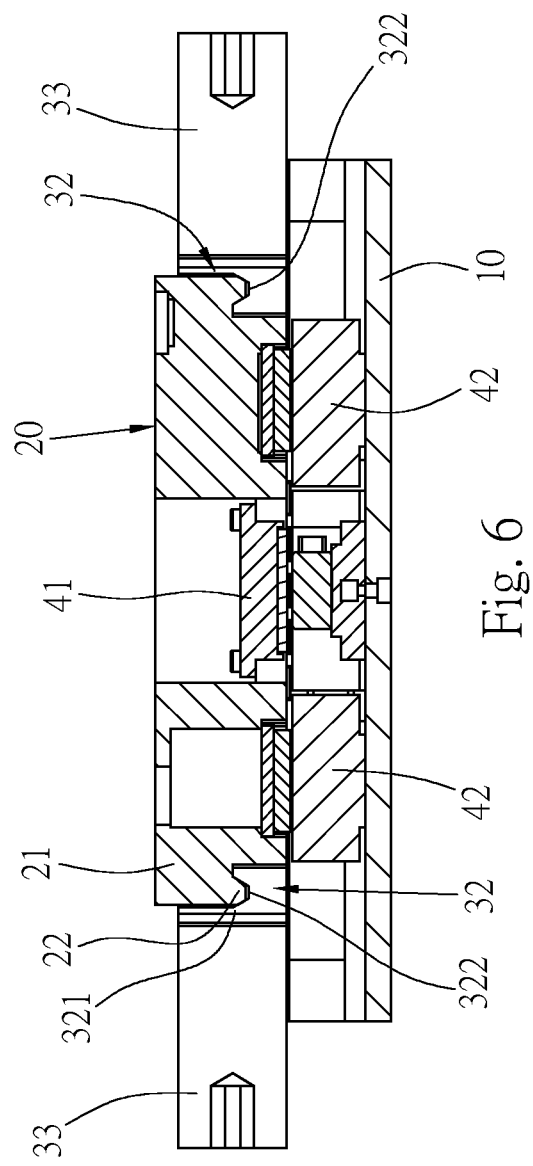
FIG. 6 is a sectional view along the sectional line 6-6 shown in FIG. 5.
Figure 7:
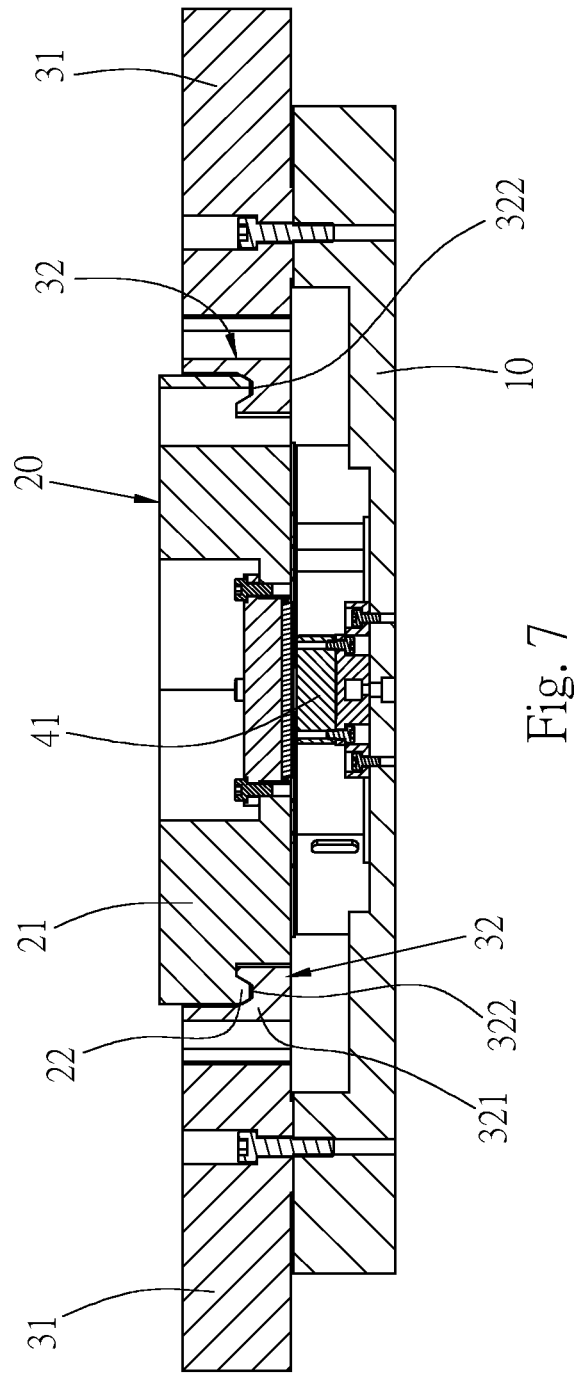
FIG. 7 is a sectional view along the sectional line 7-7 shown in FIG. 5.

Refer to FIG. 1 to FIG. 7. The flexure stage of the first embodiment of the present invention comprises a base 10, a platform 20 separated from the base 10, and a plurality of flexure units 30 disposed between the base 10 and the platform 20. In this embodiment, four modularized flexure units 30 are provided to assemble with the base 10 and the platform 20 wherein each of the flexure units 30 can be exchanged individually to raise the repair convenience and decrease the maintenance cost.

Each flexure unit 30 comprises a first section 31, a second section 32, and two third sections 33. The first section 31 is located on the base 10. The second section 32 is connected with the platform 20 and separated from the first section 31. The third sections 33 are coupled with the first section 31 and the second section 32 wherein two first bending parts 34 are coupled between the second section 32 and the third section 33 respectively, and two second bending parts 35 are coupled between the first section 31 and the third section 33 respectively. Accordingly, the first bending parts 34 and the second bending parts 35 provide flexibility in different axial directions (ex. X-axis A1 and Y-axis A2) to restrict the movement of the platform 20. Specifically, the first bending parts 34 connected with the second section 32 provide flexibility in X-axis A1 and Y-axis A2, and the second bending parts 35 connected with the first section 31 provide flexibility in X-axis A1 and Y-axis A2. In other words, each third section 33 comprises flexibility in different axial directions between the first section 31 and the second section 32. In addition, the first section 31 comprises two openings 311 holding the second bending parts 35 providing flexibility in different axial directions respectively, and the third sections 33 comprise two openings 333 holding the first bending parts 34 providing flexibility in different axial directions respectively.

Each of the second section 32 comprises a curved body 321 with a groove 322 wherein the grooves 322 are connected with each other to form an encircled groove. The platform 20 comprises a table 21 held by the second sections 32 and a protrusion 22 received within the encircled groove 322. The protrusion 22 and the encircled groove 322 are formed in complementary configuration.

The first bending part 34 comprises a first connection element 341, two first elastic elements 342 and two second elastic elements 343. The first elastic elements 342 and the second elastic elements 343 are configured within the opening 333 in parallel wherein the first elastic elements 342 are bridged between the first connection element 341 and the second section 32, and the second elastic elements 343 are bridged between the first connection element 341 and the wall of the opening 333. The first elastic elements 342 and the second elastic elements 343 are not limited in the disclosed configuration, and can be designed in diverse arrangement, number and shape according to the requirement. The first elastic elements 342 and the second elastic elements 343 comprise multiple enhancements 344 respectively to prevent from deformation.

The second bending part 35 comprises a second connection element 351, two third elastic elements 352 and two fourth elastic elements 353. The third elastic elements 352 and the fourth elastic elements 353 are configured within the opening 333 in parallel wherein the third elastic elements 352 are bridged between the second connection element 351 and the edge of the third section 33 and the fourth elastic elements 353 are bridged between the second connection element 351 and the wall of the opening 333. The third elastic elements 352 and the fourth elastic elements 353 comprise multiple enhancements 354 respectively to prevent from deformation.

In this embodiment, the flexure units 30 are modularized for convenient manufacturing, assembly and repair. The platform 20 is fastened on the four flexure units 30 through the engagement of the protrusion 22 and the encircled groove 322. Moreover, each flexure unit 30 can be fine-tuned with a screw to modify the displacement of the pitch, yaw and roll thereby increasing the assembly precision.

The flexure stage of the first embodiment of the present invention further comprises a driving unit 40 disposed between the base 10 and the platform 20 wherein the driving unit 40 comprises an encoder 41 and a plurality of linear motors 42.

As a result, the flexure units 30 and the linear motors 42 of the flexure stage provide the displacement compensation for the platform 20 such that the setting time is shortened to raise the yield efficiency.

Figure 8:
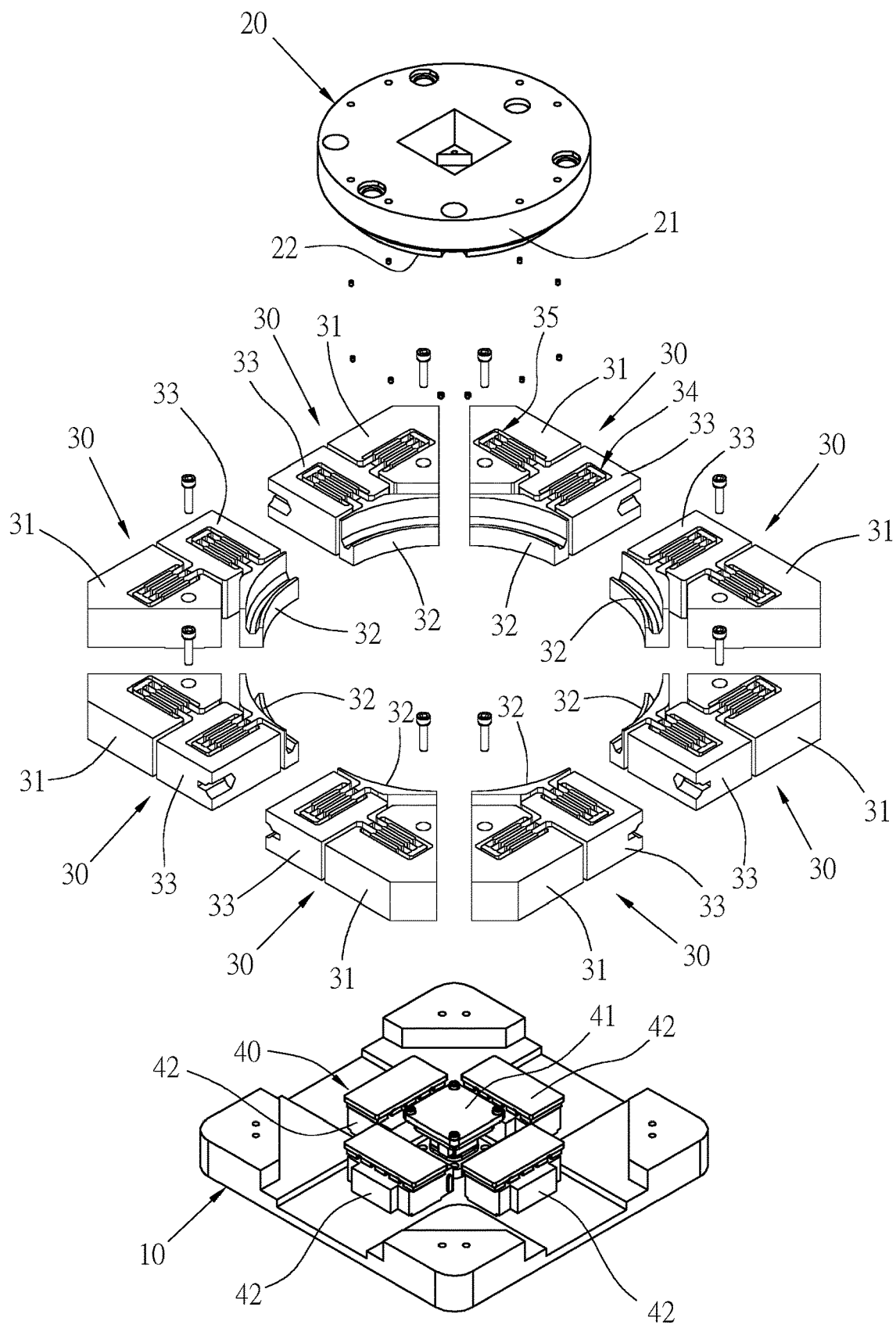
FIG. 8 is an exploded view of the flexure stage of the second embodiment of the present invention.

Refer to FIG. 8 which illustrates the flexure stage of the second embodiment of the present invention. The difference between the first embodiment and the second embodiment of the flexure stage is the number of the flexure unit 30. In the second embodiment, the flexure stage comprises eight flexure units 30 wherein the platform 20 is fastened on the eight flexure units 30 through the engagement of the protrusion 22 and the encircled groove 322. Specifically, each flexure unit 30 comprises a first section 31, a second section 32, and a third section 33. The first section 31 is located on the base 10. The second section 32 is connected with the platform 20 and separated from the first section 31. The third section 33 is coupled with the first section 31 and the second section 32 wherein the first bending part 34 is coupled between the second section 32 and the third section 33, and the second bending part 35 is coupled between the first section 31 and the third section 33.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A flexure stage, comprising:
   a base;
   a platform, separated from the base; and
   a plurality of flexure units, disposed between the base and the platform and respectively comprising a first section located on the base, a second section connected with the platform and separated from the first section, and a third section coupled with the first section and the second section through a first bending part and a second bending part wherein the first bending part and the second bending part comprises flexibility in different axial directions.

2. The flexure stage as claimed in claim 1, wherein the second section comprises a curved body with a groove connected with other grooves to form an encircled groove.

3. The flexure stage as claimed in claim 2, wherein the platform comprises a table held by the second sections and a protrusion received within the encircled groove.

4. The flexure stage as claimed in claim 3, wherein the protrusion and the encircled groove are formed in complementary configuration.

5. The flexure stage as claimed in claim 1, wherein the third section comprises an opening holding the first bending part; the first bending part comprises a first connection element, a first elastic element and a second elastic element wherein the first elastic element is bridged between the first connection element and the second section, and the second elastic element is bridged between the first connection element and a wall of the opening.

6. The flexure stage as claimed in claim 5, wherein the flexure units comprise two third sections respectively providing flexibility in different axial directions through two first elastic elements.

7. The flexure stage as claimed in claim 6, wherein the first section comprises an opening holding the second bending part; the second bending part comprises a second connection element, a third elastic element and a fourth elastic element, wherein the third elastic element is bridged between the second connection element and the edge of the third section, and the fourth elastic element is bridged between the second connection element and a wall of the opening of the first section.

8. The flexure stage as claimed in claim 7, wherein the first section comprises two openings holding the two second bending parts respectively providing flexibility in different axial directions through two second elastic elements.

9. The flexure stage as claimed in claim 1, further comprising a driving unit disposed between the base and the platform.

10. The flexure stage as claimed in claim 9, wherein the driving unit comprises an encoder and a plurality of linear motors.

* * * * *